United States Patent

Schmid et al.

[11] Patent Number: 6,150,830
[45] Date of Patent: Nov. 21, 2000

[54] TEST HEAD FOR MICROSTRUCTURES WITH INTERFACE

[75] Inventors: Rainer Schmid, Pliezhausen; Klaus Giringer; Ulrich Gauss, both of Herrenberg; Heinz Deusch, Aidlingen, all of Germany

[73] Assignee: Feinmetall GmbH, Germany

[21] Appl. No.: 09/186,860

[22] Filed: Nov. 5, 1998

[30] Foreign Application Priority Data

Nov. 5, 1997 [DE] Germany .......................... 197 48 823
Nov. 10, 1997 [DE] Germany .......................... 197 49 456
Jul. 4, 1998 [DE] Germany .......................... 198 29 934

[51] Int. Cl.[7] .................................................. G01R 31/02
[52] U.S. Cl. ........................................ 324/761; 324/754
[58] Field of Search .................................. 326/754, 755, 326/757, 758, 761; 439/482, 82

[56] References Cited

U.S. PATENT DOCUMENTS 4,622,514  11/1986  Lewis ........................................ 324/761
4,901,013  2/1990  Bendetto et al. ........................ 324/761
5,399,982  3/1995  Driller et al. ............................ 324/754
5,493,230  2/1996  Swart et al. ............................. 324/754

*Primary Examiner*—Safet Metjahic
*Assistant Examiner*—Anjan K. Deb
*Attorney, Agent, or Firm*—Ostrolenk, Faber, Gerb & Soffen, LLP

[57] ABSTRACT

A test head for making contact with test points arranged close to one another of an electric component. The test head having a plurality of contact elements which can be connected to a connecting element of a test device. The contact elements are in respective feed-through openings through two or three overlying guide panels. The contact elements are axially guidable in the feed-through openings in the panel. Various ways of securing the contact elements against falling out of the test head are provided, including friction locking of the contact elements in one panel, using a securing layer at one panel, laterally offsetting one panel with respect to the others, or by different diameters along the length of the contact element, e.g. by insulation selectively applied along the length. The connecting element and the device for making contact are detachably connected.

16 Claims, 3 Drawing Sheets

TEST HEAD FOR MICROSTRUCTURES WITH INTERFACE

BACKGROUND OF THE INVENTION

The invention relates to a test head having a device for making contact with test points of an electric component under test, which points are preferably arranged closely one next to the other.

Test heads of this type are used to make contact simultaneously with a plurality of test points, that are arranged one next to the other, of an electric component under test, for example, a semiconductor component. The test head comprises a plurality of pin-shaped contact elements which are comprised of an elastic material and, during a test procedure, they are brought to bear against one assigned test point in each case. The contact elements are part of a device for making contact, referred to below for convenience as a contactor assembly. The contact force is applied by folding out and/or bending the contact elements perpendicularly to their longitudinal extent under spring extension when the contact elements are placed on the test points or the test points are placed on the contact elements, respectively. The contact elements are arranged in feed-through openings of two guide panels which are spaced apart from one another. Owing to their function, the contact elements must be axially movably mounted in the feed-through openings of the guide panels. To prevent the contact elements in the ready-to-operate position of the test head, for example between two test procedures, dropping out of the feed-through openings under the influence of gravity, DE 23 64 786 discloses providing in the end region of a contact element a support head whose external dimensions are greater than the clear width of the feed-through openings. A counter-bearing which covers the feed-through openings is provided on the side of the upper guide panel facing away from the test specimen. The counter-bearing prevents the contact elements dropping out of the feed-through openings when the test head is turned around. The counter-bearing is non-detachably connected to the contactor assembly. As a result, the contact elements can be changed only with a large degree of expenditure, if at all, since, to do this, the counter-bearing has to be removed from the contactor assembly and the attachment means which hold the two parts together have to be destroyed. The relatively large distance between contact elements makes it no longer possible to make contact with small test points which are arranged in a very tight space, which is frequently the case, for example, with semiconductor components under test.

SUMMARY OF THE INVENTION

The object of the invention is to provide a test head in which the contact elements can be closely arranged next to each other and can easily be replaced.

A test head of the invention secures the contact elements against dropping out of the feed-through openings with securing means. The connecting element and the contactor assembly are detachably connected to one another using attachment means. As a result, the connecting element can be separated from the contactor assembly, and vice versa, enabling one of the two parts to be readily changed. Furthermore, the separation of the connecting element and the contactor assembly makes the contact elements easily accessible from the side of the contactor assembly which faces the connecting element and is intended for maintenance and repair work. In addition, it is possible for the connecting element, which is part of a test device, to be used for different contactor assembly, resulting in more universal applicability. The "different" contactor assembly may have an essentially identical structure and differ particularly in the spacing arrangement of the contact elements which is adapted to the arrangement of the test points of a specific test specimen, and/or the number of contact elements. The connecting element can therefore be used substantially universally for different test specimens. To prevent the contact elements, which are arranged in the feed-through openings in an axially displaceable fashion in a ready-to-operate position, from sliding out of the feed-through openings, for example between two test procedures, securing means secure the contact elements against loss.

In a preferred embodiment of the test head, each contact element is comprised of an electrically conductive material and has a first section which is larger in diameter and a second adjoining section which is smaller in diameter. The difference in diameters is due to an electrical insulating layer in the region of the first section. The insulating layer serves, in the first instance, to prevent electrical contact when the contact elements are touched, and at least some of which contact elements are deflected perpendicularly to their longitudinal extent during a test procedure. In the second instance, the insulating layer can be used to secure the contact elements in the contactor assembly, that is to say to protect them against loss.

In an advantageous embodiment of the test specimen, the contact elements are guided in an axially displaceable fashion with their second smaller diameter section in the respectively assigned feed-through opening of the guide. The diameter of the feed-through opening is smaller than the outer diameter of the first section, which is larger in diameter. The difference in diameter between the first and second sections forms a step, edge, or the like on the contact element. That step, edge, or the like bears against a face, edge, or the like of the guide and thus prevents the contact element dropping out under its own weight. This embodiment permits a relatively large degree of play between the second section of the contact elements and the feed-through openings, so that manufacturing costs can be relatively small.

According to a first embodiment variant, the transition between different diameters between the first and the second sections of the contact elements is formed by removing the insulation of the second section. In the manufacture of the contact elements, these elements are initially provided with the insulating layer in a first operation, and a desired length of the two sections is set in a further, second operation by removing the insulating layer in the region of the second section.

According to a further embodiment variant, the transition in diameters is brought about by applying electrical insulation in the region of the first section. Producing the difference in diameter between the first and the second section of the contact elements is simplified here in that only a single working step is necessary. This consists in providing only the first section with the insulation to a desired layer thickness by, for example, dipping the contact elements into the liquefied insulation in a defined fashion. Of course, the insulation may also be applied exclusively to the first section of the contact elements using other known manufacturing methods.

Further, an embodiment of the test head is preferred which is distinguished by the fact that the guide comprises at least two guide panels which are provided with feed-through openings for the contact elements. Each feed-through opening is assigned to one contact element. The openings in the guide panels are arranged laterally offset with respect to one another such that the contact element is held in them, or at least in one of them, in a frictional locked fashion. The holding forces which are acting on the contact element as a result of the frictional engagement between the feed-through opening or openings and the contact element arranged in it are so high that in a ready-to-operate position of the test head, that is, when the contact elements are not bearing against the test points of a component under test, the contact elements are held in the feed-through opening or openings. This reliably prevents the contact elements dropping out of the test head under their own weight. The holding forces acting on the contact elements due to frictional engagement are simultaneously however also so small that the contact elements can be displaced in the axial direction during a test procedure. In such an event, the contact elements fold out and/or bend out perpendicularly, or essentially perpendicularly, to their longitudinal extent, under spring extension in the intermediate space between the guide panels. As a result, the contact force is applied. The contact elements of the component under test may be arranged closely one next to the other, that is, at a preferably very small distance from one another, so that even the functioning of components having test points, which are small and are arranged in a very tight space, can be tested. It is therefore possible to refrain from enlarging the diameter of the contact elements in order to hold them on the test head and in the feed-through openings of the guide panels. A further advantage of the frictional locked holding of the contact elements is that they can be mounted in a service-friendly fashion, that is, it is easy both to introduce them into the test head and to replace them when necessary. For this purpose, the respective contact element merely has to be pulled out of the feed-through openings of the guide panels or pressed through them.

In a particularly preferred embodiment of the test head, a third guide panel is provided which is arranged in the intermediate space between a first guide panel and a second guide panel of the contactor assembly. At least one of the feed-through openings assigned to each contact element is offset with respect to the other feed-through openings for that contact element in the other guide panels. Preferably, the feed-through opening of the third guide panel is arranged offset with respect to the feed-through openings of the first and second guide panels, so that the contact elements are curved in a defined fashion when the test head is assembled. As a result, on the one hand, the folding force is completely eliminated and, on the other hand, there is frictional engagement between the contact elements and in each case at least one assigned feed-through opening of the guide panels. The third guide panel also ensures that the contact elements do not touch one another, in particular during a test procedure, so that, if appropriate, there is no need for electrical insulation between the contact elements, which reduces the cost of the test head.

In a preferred embodiment of the test head, the free end, facing toward and/or facing away from the test points, of each contact element has a contact tip. This enables contact to be made with very small test points which are arranged closely one next to each other. Owing to the small contact face of the contact tip on a test point, the surface pressure which is produced is relatively large so that good electrical contact develops. According to a first variant, there is provision for the pin-shaped contact elements, preferably composed of a spring-elastic material, to run to a point or to be pointed at one or both free ends to form the contact tip. The respective contact element and the contact tip are therefore integrally constructed.

In another embodiment, the contact tip is a separate component which is attached to the free end of the contact elements. This permits contact elements with different shapes and/or different sizes of contact tips to be used individually for each test head, which improves the adaptability of the test head. Irrespective of the design of the contact tip, its greatest diameter or greatest width can be smaller or greater than or the same diameter as the contact element. Then the transition from the contact element to its contact tip is either fluid and continuous or else it has at least one shoulder.

Finally, an embodiment of the test head is also preferred in which the contact elements are held in a frictionally locked fashion in feed-through openings of a securing film, elastomer layer, or the like. All the embodiment variants of the securing means for the contact elements are comprised of a flexible and electrically non-conductive material. Such securing means each have a feed-through opening for a contact element, and the diameter of the feed-through opening is smaller, at least in certain areas, than the outer diameter of the contact element. The resulting frictional engagement which is formed in this way between the securing means and the contact elements is, for example, of such magnitude that, even during a test procedure, axial displacement of the contact elements in the feed-through openings is prevented. As a function of the elastic properties of the securing means, during a test procedure, it is possible for the securing means or the regions of the securing means which are penetrated by the contact elements to be deflected in the longitudinal extent of the contact elements. After the test procedure has been terminated, the contact elements automatically spring back into their starting position. The securing forces which hold the contact elements in the feed-through openings, however, can also be so small that the contact elements in the feed-through openings are displaced axially during a test procedure. In all of the embodiments of the securing means, the securing forces are at least of such a magnitude that the contact elements are prevented from slipping out of the feed-through openings under their own weight.

Other objects and features of the invention are explained below with reference to the drawings.

DESCRIPTION OF PREFERRED EMBODIMENTS

The test head described below is used to test electronic components with small test points that are arranged next to each other. The test head can be used generally, for example, in the field of semiconductors for electrically testing high-precision printed circuit boards and semiconductor wafers.

Figure 1:
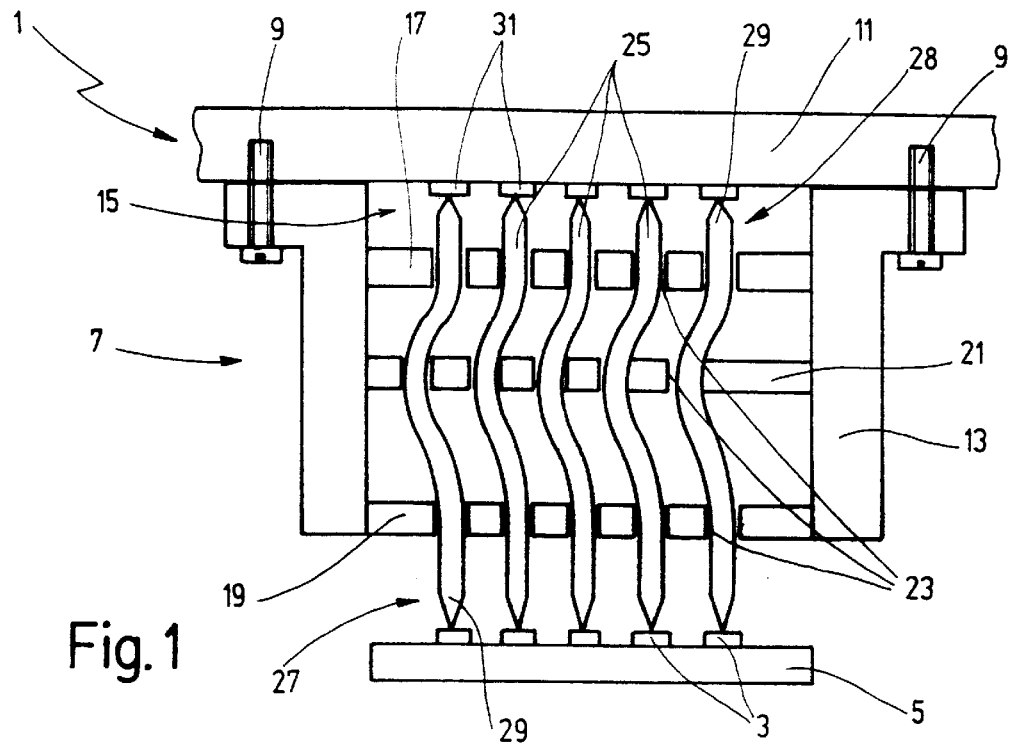
FIG. 1 shows a basic outline of a first embodiment of the test head according to the invention.

FIG. 1 schematically shows a detail of a first embodiment of a test head 1 for making simultaneous contact with a plurality of test points 3, arranged one next to the other, of an electric component 5 under test. The test head 1 comprises a contactor assembly 7, which is detachably connected, using attachment means 9, to a connecting element 11, for example, a printed circuit board, of a test device which comprises, for example, a test voltage source or the like. In this embodiment, the attachment means 9 are formed by externally threaded screws and only two screws are illustrated in FIG. 1. Each screw engages through a drilled hole in the base body 13 of the test head 1 and is screwed into threaded drilled holes in the connecting element 11. The attachment means 9 may, of course, also be formed as pin connections, shaft/hub connections or by clamps, springs or the like. It is important that the cohesion of the connecting element 11 and of the contactor assembly 7 is provided by a detachable connection. The attachment means are therefore not destroyed when the two parts are separated.

The contactor assembly 7 comprises a sleeve-shaped or tubular base body 13. Within the interior portion 15 of base body 13 are disposed a first guide panel 17, a second guide panel 19 and a third guide panel 21 which are held in spaced parallel relation to one another in any suitable manner, with panel 21 located between panels 17 and 19. Feed-through openings 23 provided in the guide panels 17, 19, 21 receive pin-shaped contact elements 25, also referred to as test probes, which are guided in the openings in an axially displaceable fashion, only five contact elements are illustrated in the test head of FIG. 1. A test head of the type here can comprise up to several thousand contact elements. The contact elements 25 are comprised of an elastic, preferably spring-elastic material, for example spring metal, and are shown here as buckling wires. The guide panels 17, 19, 21 are preferably comprised of an electrically non-conductive material, for example a plastic, glass, ceramic, silicon, or the like. In another embodiment (not illustrated), in place of or in addition to the guide panels, the guide for the contact elements comprises guide elements with a thickness that is greater than the thickness of the guide panels.

Figure 2:
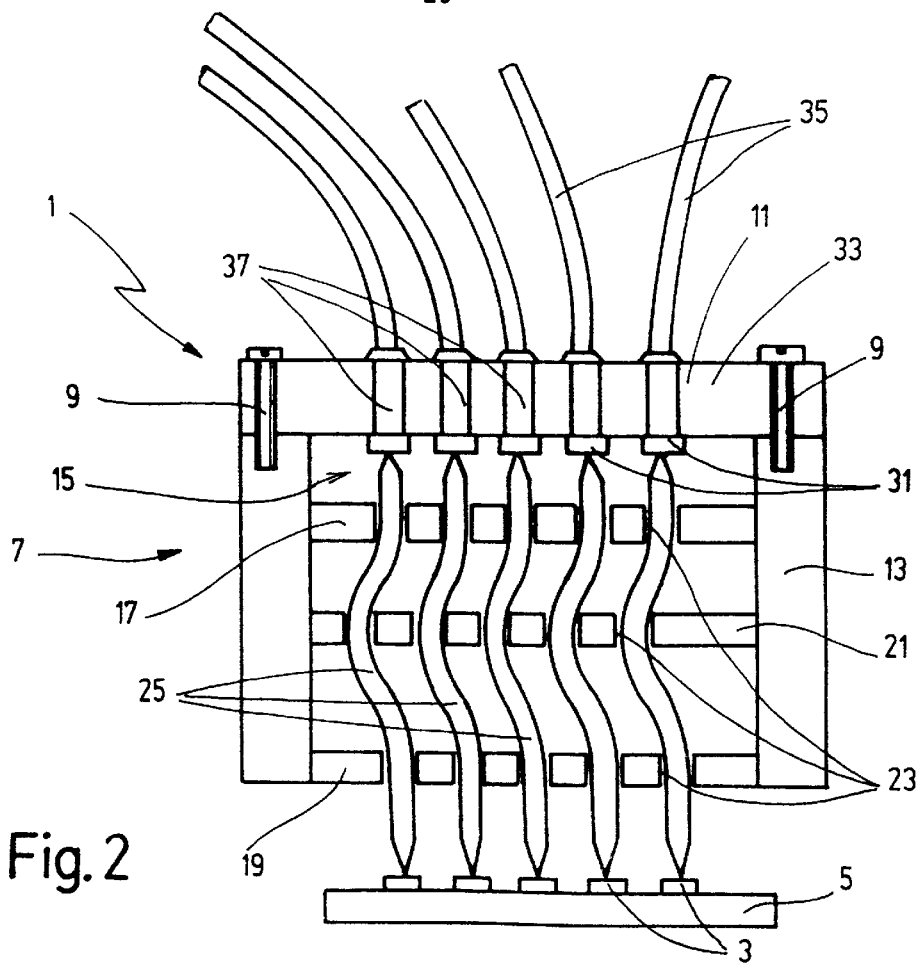
FIG. 2 shows a basic outline of a second exemplary embodiment of such a test head.

In FIG. 1, the feed-through openings 23, assigned to one contact element 25, of the first and second guide panels 17 and 19, respectively, are arranged aligned with one another. The respective assigned feed-through opening 23 of the third guide panel 21, which is arranged in the space between the first and second guide panels, is laterally offset with respect to the feed-through openings 23 of the guide panels 17, 19. As a result, the contact elements 25 arranged in the three feed-through openings 23 have a curve in them or a curved shape. By deflecting the contact elements 25 perpendicular to their longitudinal extent, a transverse restoring force is set up due to the resilient nature of the material of which the contact elements are formed. This force tends to push the contact elements against the walls of various ones of the feed-through openings 23 (as illustrated in FIGS. 1 and 2), and results in a frictional engagement between the contact elements 25 and at least one of the assigned feed-through openings 23 of the guide panels 17, 19, 21. The contact elements 25 are held exclusively by friction in the base body 13 of the contactor assembly 7. The contact elements 25 are thus reliably prevented from dropping out or slipping out from the feed-through openings 23.

The contact elements 25 have contact tips at their free end 27 facing the test points 3 of the component under test 5 and at their free end 28 facing the connecting element 11. Each contact tip 29 is formed by pointing the pin-shaped contact elements 25. The contact elements 25 can be pressed with their free end 28 facing away from the test points 3 against one assigned contact point 31 in each case. The contact points 31, in the embodiment illustrated in FIG. 1, are provided on the connecting element 11 of the test device. The free end 27 of the contact elements 25 can be pressed onto, in each case, one assigned test point 3 of the component 5 under test.

The operation of the test head 1 is explained below with reference to a test procedure. In the operational position of the contactor assembly 7, as illustrated in FIG. 1, the elongated contact elements 25 are in contact with both the test points 3 of the component 5 under test and the contact points 31 on the connecting element 11. Relative movement between the contactor assembly 7 and the component 5 under test axially displaced, the contact elements 25 in the feed-through openings 23 of the guide panels 19 and 21. The contact elements 25, which have already been curved by the lateral offset of the feed-through openings of the third guide panel 21, are deflected by the application of pressure to the pin-shaped contact elements 25 in the longitudinal direction. The restoring forces generated by the elastic or resilient properties of the material of the contact elements press the contact elements 25 here with their contact tips 29 in a defined fashion onto the test points 3 of the component 5 under test and onto the contact points 31 of the connecting element 11, achieving low electrical contact resistance. It is then possible to test the continuity of the test points 3 and their insulation with respect to one another, and to test the functioning of the component 5 under test. After the test procedure, the contactor assembly 7 and the component 5 under test are separated. The deflected/curved contact elements 25 are then automatically displaced back into their initial position because of their elastic properties.

The contact points 31 on the connecting element 11 serve as an abutment for the contact elements 25. In one embodiment (not illustrated) of the test head, in the ready-to-operate position of the test head 1, the contact elements 25 are spaced away from the contact points 31. As a result, when contact is made with the test points, the contact elements 25 are initially displaced axially to such an extent that they bear against the contact points 31. It is only then possible to bend the contact elements 25 further and to thus generate the contact forces which press the contact tips 29 of the contact elements 25 against the respective test point 3 or the respective contact point 31.

The test head 1 embodiment in FIG. 1 is distinguished by a very compact design and a high level of adaptability to, for example, different components under test and/or test parameters.

FIG. 2 is a schematic view of a second embodiment of the test head 1. Components which correspond to those in FIG. 1 are provided with the same reference symbols, and their description is provided for FIG. 1.

The contactor assembly 7 is connected in a detachable fashion by attachment means 9, shown as screws in this embodiment, to a connecting element 11. The element 11 comprises a connecting head 33 of the test device, which carries the contact points 31. The screws 9 engage through feed-holes in the connecting element 11 and are screwed into threaded drilled holes in the base body 13 of the test head 1. Each contact point 31 is connected to the free end of a line 35. These lines are connected to the test device directly or via plug-type connectors (not illustrated). The lines 35 are secured, for example bonded, in holes 37 of the connecting head 33. The contact points 31 are connected in each case to the free end of a line 35. The lines are connected to the test device via plug-type connectors (not illustrated) or directly. The lines 35 are attached, for example bonded in, to holes 37 of the connecting head 33.

In both the embodiments in FIGS. 1 and 2, the contactor assembly 7 can easily be separated from the other components of the test head 1 by detaching the attachment means 9. The contact elements 25 are then accessible from the two openings into the feed-through hole 15. This makes it easier to replace individual contact elements 25. Because the contact elements 25 are held only by frictional engagement in at least one of the feed-through openings 23 of the guide panels 17, 19, 21, the elements 25 can be readily removed from the feed-through openings and new contact elements can be easily inserted.

In summary, the test head 1 described with reference to FIGS. 1 and 2 is of simple design and can be manufactured cost-effectively, particularly because the contact elements are held only by frictional engagement in the feed-through openings of the guide panels or by frictional engagement in the feed-through opening of one of the guide panels. Using the test head, it is possible to test finely structured components with very small test points which are arranged at a small distance from one another. Good electrical contact can be achieved both between the contact element and the test point and between the contact element and the contact point with the aid of the pointed contact elements and, particularly their contact tips, by virtue of the high surface pressure.

Figure 3:
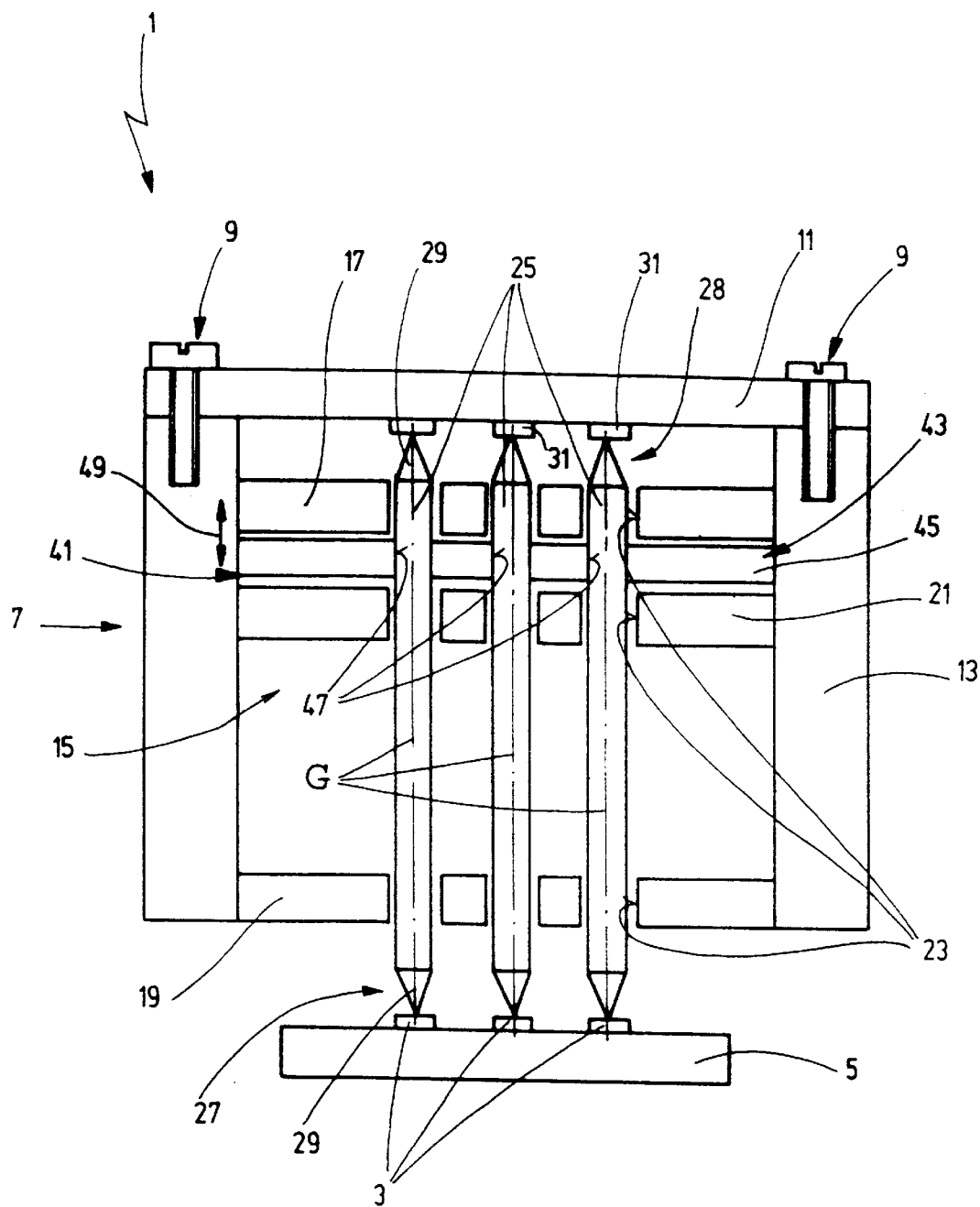
FIGS. 3 and 4 each show a section of a further exemplary embodiment of the test head.

FIG. 3 shows a basic outline of a third embodiment of the test head. Identical parts are again provided with identical reference symbols. Details are provided as to the differences. The test head 1 comprises a guide, as in the embodiment of FIGS. 1 and 2, which comprises three guide panels 17, 19, 21 which are arranged at a distance from one another and are attached in a feed-through hole 15 of a base body 13 of the test head 1. Feed-through openings 23 are provided in the guide panels 17, 19, 21 for receiving contact elements 25 in this embodiment. The openings 23 in the three panels for each contact element 25 are aligned and are therefore not offset laterally. The longitudinal axes of the feed-through openings 23 for each contact element are arranged one behind the other on an imaginary straight line G in the guide panels, the line being represented by a broken line in FIG. 3.

A securing means 43, in this embodiment a securing film 45 preferably comprised of flexible material, is disposed in the intermediate space 41 between the guide panels 17 and 21. The securing film 45 also has feed-through openings 47 which are aligned with the feed-through openings 23 in the guide panels 17, 19, 21 and each opening 47 holds one contact element 25 in a frictional locked fashion. The diameter of the feed-through opening 47 is, at least in certain sections, smaller than the outer diameter of the contact elements. The securing film 45 can move freely between the guide panels 17, 21 in the axial direction of a double arrow 49. The securing film 45 between the guide panels 17, 21 and the frictional locked securement of the contact elements in the feed-through openings 47 secures the contact elements 25 against sliding or dropping out of the contactor assembly 7. The securing film 45 may be attached in a non-displaceable fashion in the feed-through hole 15 of the base body 13, enabling only certain areas of the clamped-in securing film to be deflected or bent during a test procedure.

In one variant of the test head embodiment in FIG. 3, the feed-through openings 23 for each contact element 25 provided in the first and second guide panels 17 and 19 are aligned, while the respective feed-through opening 23 in the third guide panel 21, which is between the guide panels 17, 19, is laterally offset with respect to the feed-through openings 23 of the other guide panels. This deflects the contact elements in the feed-through openings perpendicularly to their longitudinal extent, developing an arc. This gives the contact elements a preferred direction to deflect when subjected to pressure loading. Thus, the preferred bending direction of the contact elements can be set by laterally offsetting the guide panels or their feed-through openings with respect to one another. This variant of the test head is particularly advantageous in that, in the mounted state, the bent shape of the contact elements completely eliminates the force necessary for bending the contact elements. It is readily apparent that the feed-through openings 47 in the securing film 45 can also be arranged laterally offset with respect to the feed-through openings 23 in at least one of the guide panels 17, 19, 21.

In a further advantageous embodiment, the securing means 43, for example the securing film 45, is preferably comprised of a flexible material, or an elastomer layer, and is provided on at least one of the guide panels 17, 21, for example, on the side of the guide panels facing the intermediate space 45. This can simplify the manufacture, in particular the mounting, of the test head 1.

Figure 4:
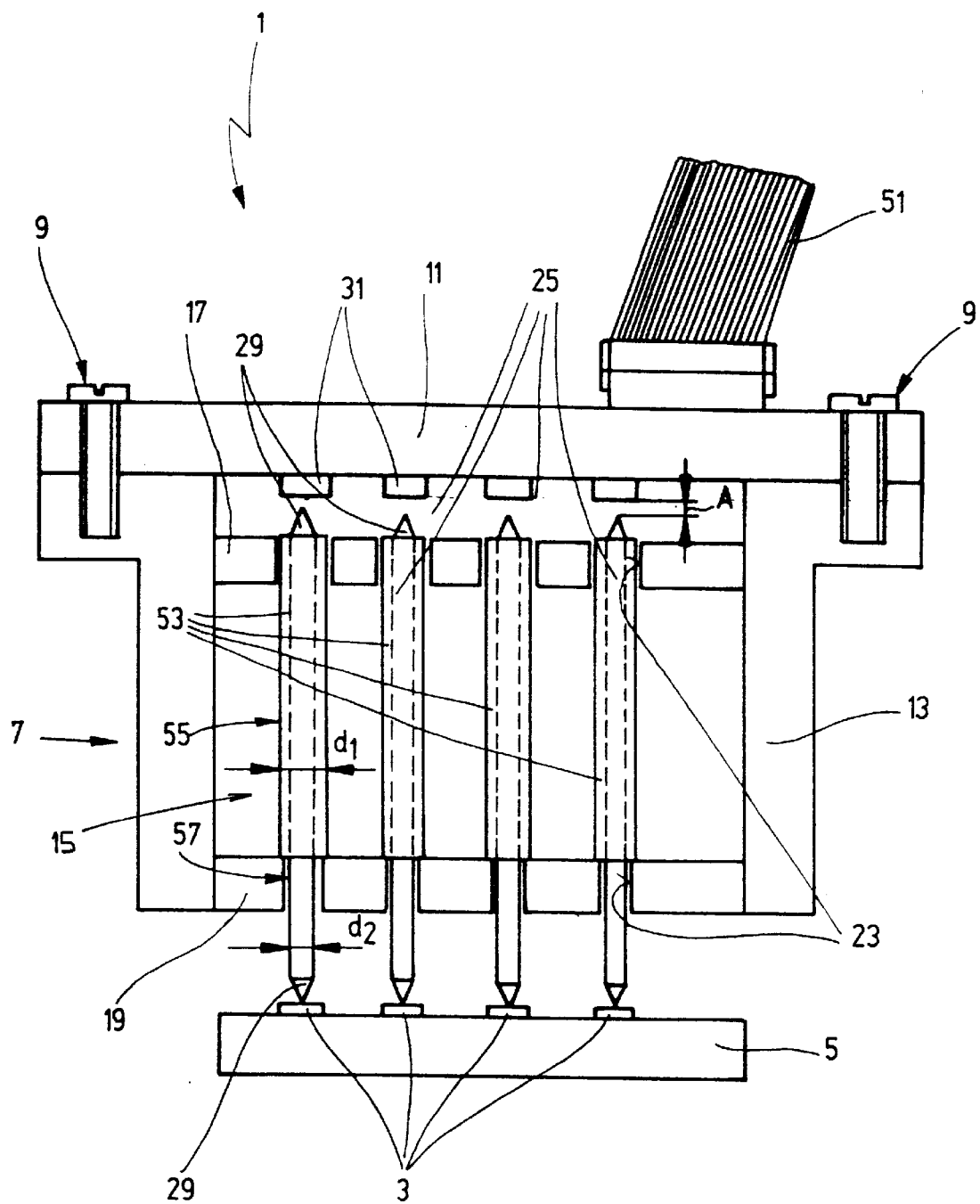

FIG. 4 shows a detail of a further embodiment of the test head 1, comprising a contactor assembly 7 with a base body 13 to which a connecting element 11 is detachably attached using attachment means 9. The contact points 31 provided on the connecting element 11 are here connected to the test device via a ribbon cable 51. In this embodiment, the device 7 for making contact comprises only two guide panels 17, 19 which are attached in the feed-through hole 15 of the base body 13 and are parallel to one another and spaced apart a distance. Contact elements 25 arranged in the feed-through openings 23 provided in the guide panels 17, 19 include an electrically insulating layer 53 over at least certain sections of their longitudinal extent. The insulating layer 53 provides a first section 55 of larger diameter, and a second, adjoining section 57 of smaller diameter. The difference in diameters is due to the insulating layer 53 in the region of the first section 55. The contact elements 25 are guided in an axially displaceable fashion by their second smaller diameter section 57, in the respective feed-through opening 23 of the guide panel 19, and by their first larger diameter section 55, in the feed-through openings 23 of the guide panel 17.

The diameter of the feed-through openings 23 in the guide panel 19 is smaller than the diameter of the contact elements in the region of their first section 55. This prevents the contact elements 25 from dropping out of the device 7 due to gravity when making contact in the direction of the test specimen 5. On that side of the contact assembly 7 facing away from the test specimen 5, the contact elements 25 are also secured against dropping out, because the feed-through hole 15 in the base body 13 is covered by the connecting element 11 which is detachably attached to the base element 13.

The first section 55 has a larger diameter $d_1$, and the second section 57 has a smaller diameter $d_2$, which corresponds here to the outer diameter of the contact elements 25. In FIG. 4, the length of the first section 55 is selected such that, in the unloaded state of the contact elements 25, for example, between two test procedures, a gap A is provided between the contact tips 29 of the contact elements 25 and the contact points 31 on the connecting element 11. When the test head 1 is fitted on to the test specimen, or vice versa, the contact elements 25 are displaced in the axial direction until the contact tips 19 bear against the contact points 31. Pressure applied to the contact elements 25 may deflect them in the intermediate space between the guide panels 17 and 19 transversely with respect to their longitudinal extent so that the restoring forces generated by the elastic property of the material presses the contact tips of the contact elements against the test points 3 and the contact points 31.

The difference $d_1$–$d_2$ in diameters in this exemplary embodiment is caused by removing the insulation from the second section 57. The contact elements 25 are at first completely covered with the insulating layer, which is then removed in the regions of the second section 57 and at the contact tips. However, it is also possible for the difference in diameters, that is, the stepped transition from the first section 55 of the contact elements to the adjoining, second section 57, to also be realized from the outset applying an electrically insulating layer only to the region of the first section 55. Insulation is applied only to a defined length of the contact elements, which enables the manufacture of the contact elements to be simplified, since the difference in diameters can be manufactured in one operation.

In one variant of the exemplary embodiment of the test head in FIG. 4, the feed-through openings 23 for each contact element in the guide panels 17, 19 are arranged laterally offset or misaligned with respect to one another producing a bent shape of the contact elements. This completely eliminates the bending force and predefines a preferred direction, in which the contact elements are deflected when pressure is applied to their ends, for example during a test procedure.

All the embodiments of the test head 1 described with reference to FIGS. 1 to 4 hold the contact elements 25 in a simple and cost-effective manner, using securing means in or on the contactor assembly 7, to prevent the contact elements from sliding out of the feed-through openings of the guide panels. The configuration of the securing means, for example, two guide panels with feed-through openings which are arranged laterally offset and in which the contact elements are held in a frictionally locking and prebent, captive fashion, enables the contact elements to be arranged particularly close to one another so that test specimens with a narrowly spaced apart arrangement of test points can be readily tested. Furthermore, it is particularly advantageous that the connecting element 11 and the contactor assembly 7 are detachably connected. This ensures that the contact elements 25, which are held in the feed-through hole 15 of the base body 13, are easily accessible from both sides of the feed-through hole. Furthermore, in some embodiments, it may be possible to exchange individual contact elements from both sides of the feed-through hole 15.

The possibility of separating the connecting element and the contactor assembly in a non-damaging and simple way permits one of these parts to be exchanged quickly. In addition, the test head can be used to test a plurality of embodiments of test specimens which have a different spacing arrangement of the test points. It is only necessary to replace the contactor assembly 7 with another such element of a correspondingly different design.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A test head for making contact with test points of an electric component under test, the test head comprising:
   a connecting element which connects the test head to a test device;
   a plurality of contact points on the connecting element;
   a contactor assembly including:
      a first guide panel having first and second sides and a plurality of feed-through openings extending between the sides; and
      a plurality of contact elements, each contact element having
      a first axially elongated portion extending through one of the feed-through openings, the first portion of the contact element having a first transverse dimension which is sufficiently smaller than the feed-through opening so that the feed-through opening does not impede axial movement of the first portion of the contact element; and
      a second axially elongated portion having an electrically insulating sleeve thereon, the insulating sleeve having a second transverse dimension which is greater than the feed-through opening so that the insulating sleeve is unable to enter the feed-through opening, thereby providing a retaining mechanism which prevents the contact element from dropping out of the feed-through opening in the guide panel,
      each contact element further having one end which is axially aligned with one of the contact points on the connecting element and an opposite end which engages with a test point on the component under test when the test head is in use.

2. The test head of claim 1, wherein one end of the insulating sleeve forms a shoulder which cooperates with one side of the first guide panel to prevent the insulating sleeve from entering the feed-through opening.

3. The test head of claim 2, wherein the length of the second portion of each contact element is less than the axial distance between the one side of the first guide panel and the contact points on the connecting element, whereby each contact element is movable in the axial direction from a position in which its shoulder is in contact with the one side of the first guide panel to a position in which the one end of the contact element engages a contact point on the connecting element.

4. The test head of claim 1, further comprising a plurality of connector elements which detachably secure the connecting element and the contactor assembly together as a single unit.

5. The test head of claim 1, further comprising a second guide panel spaced from the first guide panel, the second guide panel having a plurality of second feed-through openings which receive the second portions of respective ones of the contact elements, the second feed-through openings having a transverse dimension which is sufficiently larger than the insulating sleeves so that the second feed-through openings do not impede axial movement of the second portions of the contact element.

6. The test head of claim 5, wherein the contactor assembly further comprises:
   a base body having a wall defining an interior portion, the first and second guide panels being located at fixed positions within the interior portion, and axially spaced relative to the contact elements; and
   a plurality of connectors which detachably secure the connecting element to a first end of the base body,
   the first guide panel being positioned adjacent to a second end of the base body with its first side facing the interior of the base body, and the second guide panel being positioned between the first guide panel and the first end of the base body.

7. The test head of claim 5, wherein a respective one of the first and second feed-through openings respectively in the first and second guide panels receive one of the contact elements and the first and second feed-through openings that receive the contact element are in axial alignment.

8. The test head of claim 5, wherein the length of the second portion of each contact element is less than the axial distance between the one side of the first guide panel and the contact points on the connecting element, whereby each contact element is movable in the axial direction by a distance equal to the difference between the length of the second portion of each contact element and the axial distance between the one side of the first guide panel and the contact points on the connecting element.

9. The test head of claim 1, wherein the guide panel is spaced from the connecting element, and the length of the second portion of each contact element is less than the distance between the guide panel and the contact points on the connecting element, whereby each contact element is movable in the axial direction by a distance equal to the difference between the length of the second portion of each contact element and the distance between the guide panel and the contact points on the connecting element.

10. The test head of claim 1, wherein each contact element is comprised of an elastic material.

11. The test head of claim 1, wherein each contact element comprises a buckling wire.

12. The test head of claim 1, wherein the second end of each contact element includes a contact tip thereon.

13. The test head of claim 1, wherein the second end of each contact element is shaped and positioned to be pressed onto the test point with which it is axially aligned.

14. The test head of claim 12, wherein the first end of each contact element can be pressed against the connecting element contact point with which it is axially aligned for making electrical contact with the test device.

15. The test head of claim 14, wherein each of the contact points on the connecting element is connected to the test device by a wire.

16. The test head of claim 1, wherein the cross-section of each of the contact elements and the insulating sleeves, and the pass-through openings are circular.

* * * * *